United States Patent
Chung et al.

(10) Patent No.: US 6,767,834 B2
(45) Date of Patent: Jul. 27, 2004

(54) METHOD OF MANUFACTURING A CONTACT OF A SEMICONDUCTOR DEVICE USING CLUSTER APPARATUS HAVING AT LEAST ONE PLASMA PRETREATMENT MODULE

(75) Inventors: Seung-pil Chung, Seoul (KR); Kyeong-koo Chi, Seoul (KR); Ji-soo Kim, Daejeon (KR); Chang-woong Chu, Suwon (KR); Sang-hun Seo, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 09/983,790

(22) Filed: Oct. 25, 2001

(65) Prior Publication Data

US 2002/0064944 A1 May 30, 2002

(30) Foreign Application Priority Data

Nov. 24, 2000 (KR) ........................................ 2000-70491

(51) Int. Cl.[7] ....................... H01L 21/26; H01L 21/302; H01L 21/461
(52) U.S. Cl. ...................... 438/709; 438/700; 438/795
(58) Field of Search ................................ 438/706–732, 438/672, 675, 680, 733, 795, 700

(56) References Cited

U.S. PATENT DOCUMENTS

| 5,306,671 | A |   | 4/1994 | Ogawa et al. |         |
|-----------|---|---|--------|--------------|---------|
| 5,328,558 | A | * | 7/1994 | Kawamura     | 156/643 |
| 5,350,480 | A | * | 9/1994 | Gray         | 156/345 |
| 5,681,780 | A | * | 10/1997| Mihara et al.| 437/228 |
| 6,110,836 | A |   | 8/2000 | Cohen et al. |         |
| 6,333,268 | B1| * | 12/2001| Starov et al.| 438/691 |
| 6,346,489 | B1| * | 2/2002 | Cohen et al. | 438/789 |
| 6,492,272 | B1| * | 12/2002| Okada et al. | 438/690 |

FOREIGN PATENT DOCUMENTS

| KR | 1998-077122 | 11/1998 |
|----|-------------|---------|
| WO | WO 99/34424 | 7/1999  |

OTHER PUBLICATIONS

M.C. Peignon et al., "Contact Etching Process Characterization by Using Angular X–Ray Photoelectron Spectroscopy Technique", J. Electrochem. Soc., vol. 143, No. 4, Apr. 1996, pp. 1347–1354.

Hidemitsu Aoki et al., "Direct analysis of contamination in submicron contact holes by thermal desorption spectroscopy", J. Vac. Sci. Technol. A 13(1), Jan/Feb 1995 American Vacuum Society, pp. 42–46.

* cited by examiner

Primary Examiner—Caridad Everhart
Assistant Examiner—Lee Calvin
(74) Attorney, Agent, or Firm—Volentine Francos, PLLC

(57) ABSTRACT

A method of manufacturing a contact of a semiconductor device includes a series of pretreatment processes each performed in a plasma pretreatment module. A semiconductor substrate has an interlayer formed on an underlayer of a material containing silicon. A contact hole is formed in the interlayer to expose a surface of the underlayer. Subsequently, the semiconductor substrate is loaded into a plasma pretreatment module. The photoresist pattern is removed by ashing in the plasma pretreatment module. A damaged layer at the surface exposed by the contact hole is then removed in the plasma pretreatment module. Subsequently, the semiconductor substrate is pre-cleaned in the plasma pretreatment module. The semiconductor substrate is then transferred, while in a vacuum, to a deposition module. There, an upper layer is formed on the substrate to fill the contact hole.

29 Claims, 6 Drawing Sheets

METHOD OF MANUFACTURING A CONTACT OF A SEMICONDUCTOR DEVICE USING CLUSTER APPARATUS HAVING AT LEAST ONE PLASMA PRETREATMENT MODULE

BACKGROUND OF THE INVENTION

1. Field of the Invention

The present invention relates to a method of manufacturing a contact of a semiconductor device using apparatus having a plasma pretreatment module. More particularly, the present invention relates to pretreatment processes from the time a contact hole is formed using a photoresist pattern to the time material is deposited in the contact hole.

2. Description of the Related Art

A highly integrated semiconductor device is produced by stacking numerous conductive or semiconductor layers one atop the other with respective insulating layers interposed therebetween, and connecting the conductive or semiconductor layers to one another. Typically, a contact hole is used to electrically connect the conductive layers or semiconductor layers. A method of forming such a highly integrated semiconductor device includes steps of forming a lower (conductive or semiconductor) layer, forming an insulating layer thereon, forming a contact hole through the insulating layer and which contact hole exposes the lower layer, and forming an upper (conductive or semiconductor) layer on the insulating layer that fills the contact hole with conductive material.

In general, the contact hole is formed by a plasma dry etching process. In this process, the insulating layer is etched by reactive ions of plasma moving at high speeds. Because manufacturing a semiconductor device almost always involves anisotropic etching, the plasma dry etching process is one of the essential processes in the manufacturing of semiconductor devices.

However, when plasma dry etching is carried out, reactive ions of the plasma create a lattice defect on the surface of the wafer or damage the surface that becomes exposed at the bottom of the contact hole. If allowed to exist, such a defect or damage would adversely affect the electrical characteristics of the device.

Accordingly, conventional treatment processes include a process of annealing the wafer to prevent the surface thereof from being damaged during the plasma etching process, and a plug implantation process after the contact hole is formed to correct for any damage at the surface defining the bottom of the contact hole. Also, there is known a process of removing the damaged layer at the bottom of the contact hole.

FIG. 1 shows a conventional manufacturing method from the time a contact hole is formed to the time an upper conductive or semiconductor layer is formed. Referring to FIG. 1, the contact hole is formed by a plasma dry etching apparatus (S10). In general, the contact hole is formed by forming an insulating layer on a semiconductor substrate or other specific underlayer (or "bottom layer"), forming a photoresist pattern on the insulating layer using a photolithographic technique, and etching the insulating layer using the photoresist pattern as an etching mask.

Next, the semiconductor substrate is moved to an ashing apparatus, whereupon the photoresist pattern is ashed and removed (S12). Next, a photoresist (PR) strip process is performed (S14). In this process, the semiconductor substrate is transferred from the ashing apparatus to a wet tub filled with sulfuric acid to remove remnants of the photoresist pattern that were not removed by the ashing process.

Next, a residue processing process is performed to remove a damaged layer formed by the plasma dry etching process at the surface of the semiconductor substrate or at the surface of the specific underlayer defining the bottom of the contact hole (S16). The residue processing process is performed using a low bias condition and $CF_4$ or oxygen gas. Next, a pretreatment cleaning process is performed in the wet tub (S18) to remove another damaged layer formed by the residue processing process and to remove any remaining contaminants, such as carbon, from the contact hole.

Subsequently, the pre-processed semiconductor substrate is transferred to a deposition apparatus, whereupon the upper layer is formed to fill the contact hole (S20).

However, the conventional manufacturing method is subject to the following problems.

First, the photoresist (PR) strip process requires significant processing time and increases the probability that the semiconductor substrate will be contaminated because the PR strip process is performed in a wet tub filled with sulfuric acid.

Second, the surface exposed by the contact hole can be damaged by the residue processing process performed by the dry etching apparatus. However, even though the damaged layer can be removed by performing a pre-treatment cleaning process in a wet tub, the etch rates of various layers defining the side walls of the contact hole vary with respect to the cleaning solution used in the pretreatment cleaning process. Thus, the side walls defining the contact hole become uneven and the pattern formed on the semiconductor substrate deteriorates due to over-etching.

Third, even after the pretreatment cleaning process is performed, a new natural oxide film is formed on the surface defining the bottom of the contact hole as the semiconductor substrate is transferred to the deposition apparatus. The natural oxide film prevents a good contact from being established between the surface of the lower layer defining the bottom of the contact hole and the upper layer formed by the deposition process.

Fourth, it is difficult to integrate the processes because the dry etching and deposition processes are generally performed on one wafer at a time, whereas the photoresist PR strip process and the pretreatment cleaning process featuring the use of a wet tub are batch processes. Accordingly, the semiconductor substrates must be transferred through separate processing apparatus, whereby the substrate are more apt to become contaminated. Therefore, although a great deal of processing time is spent, many of the devices still will have inferior electrical characteristics.

SUMMARY OF THE INVENTION

An object of the present invention is to solve the above-described problems of the prior art.

More specifically, an object of the present invention is to provide a method of forming a contact of a semiconductor device in which the pretreatment processes necessary for forming a good contact can be performed in a relatively short time.

Another object of the present invention is to provide a method of forming a contact of a semiconductor device in which the pretreatment processes necessary for forming a good contact are performed without the semiconductor substrate being contaminated in the interim between processes.

To achieve these objects, the present invention provides a method in which the pretreatment processes, from the time the contact hole is formed to the time the contact hole is filled, are carried out using plasma.

The contact hole is formed using a photoresist pattern as an etching mask, wherein the surface of an underlying material comprising silicon is exposed. Subsequently, the semiconductor substrate is loaded into a clustered apparatus having one or more plasma pretreatment and deposition modules connected to each other through means in which a vacuum can be maintained. In a first pretreatment process, the photoresist pattern is removed by ashing. In a second pretreatment process, a damaged layer at the surface exposed by the contact hole is removed. In a third pretreatment process, the semiconductor substrate is cleaned. The semiconductor substrate is then transferred to the deposition module while the substrate is kept in a vacuum. There, a film is formed on the substrate to fill the contact hole and thereby establish electrical contact with the underlayer.

The underlayer can be a silicon, polysilicon, or silicide layer. The upper layer formed to fill the contact hole is a conductive film such as one formed of a polysilicon layer and a metal layer.

The plasma pretreatment module is designed to generate remote plasma using microwaves. In this respect, the process of ashing the photoresist pattern is performed using nitrogen gas and oxygen gas in a plasma state, followed by an application of UV light. The process of removing the damaged layer is performed using nitrogen gas and oxygen gas in a plasma state and a fluorine-based gas in a plasma state or in a normal gaseous state. And, the cleaning process comprises using hydrogen gas and a fluorine-based gas in a plasma state to cause a chemical reaction with an oxide layer on the surface of the underlayer exposed at the bottom of the contact hole, thereby forming a reaction layer, and annealing the reaction layer vaporize the same.

According to the present invention, an ashing process, a residue processing process, and a pretreatment cleaning process may be continuously performed in a plasma pretreatment module of a clustered apparatus. Thus, the pretreatment processing time can be minimized. Also, contaminants are prevented from accumulating in the contact hole in contrast to the case in which the semiconductor substrate is transferred among the various processing apparatus of the prior art.

In addition, the deposited material and the surface exposed by the contact hole contact each other well because a vacuum is maintained between the plasma pretreatment module and the deposition module to prevent a natural oxide film from being grown on the exposed surface after the pretreatment cleaning process is performed.

BRIEF DESCRIPTION OF THE DRAWING(S)

The above and other objects, features and advantages of the present invention will become more apparent by referring to the following detailed description of the preferred embodiments thereof made with reference to the attached drawings, of which:

DETAILED DESCRIPTION OF THE PREFERRED EMBODIMENTS

The present invention will now be described more fully with reference to the accompanying drawings. It should be understood, however, that when a layer is described as being "on" another layer or substrate, such a description means that the layer in question can be disposed directly on the other layer or substrate, or intervening layers may be interposed therebetween.

Figure 1:
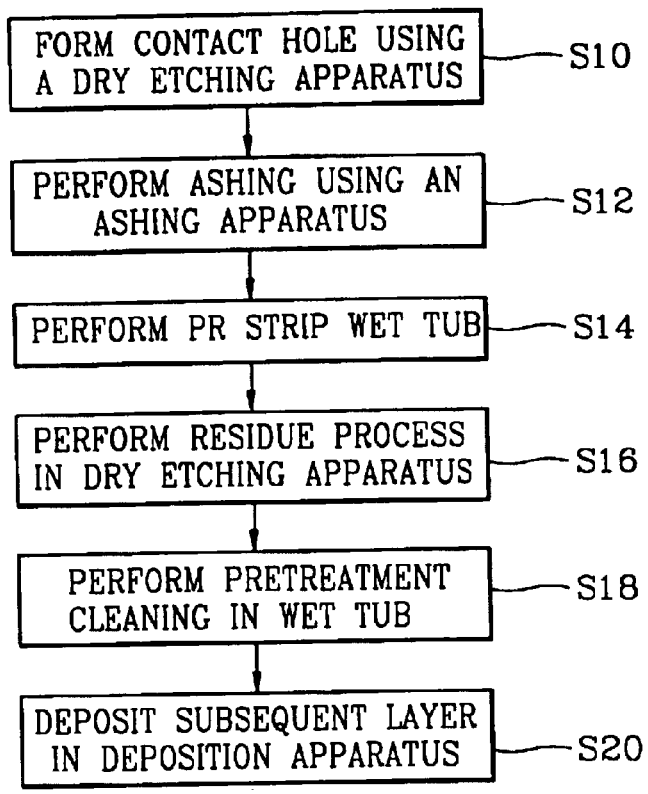
FIG. 1 is a block diagram of a conventional method of forming a contact in the process of manufacturing a semiconductor device.
Figure 2:
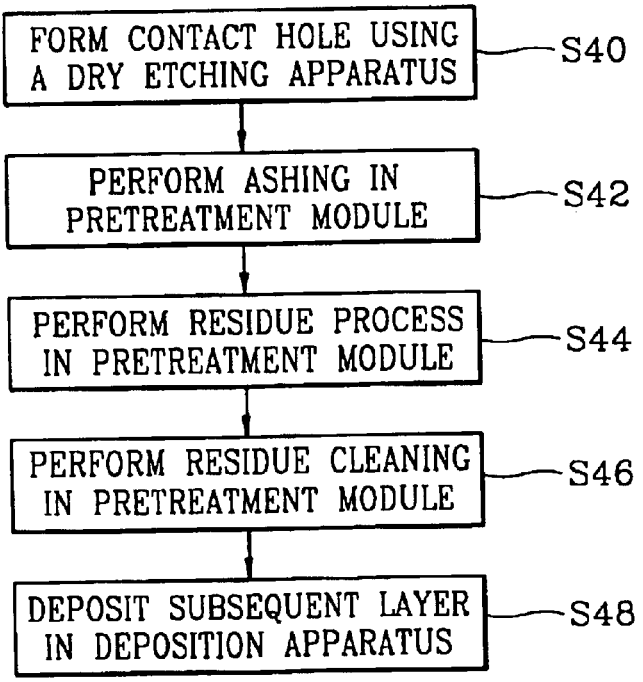
FIG. 2 is a block diagram a method of forming a contact of a semiconductor device according to the present invention.

FIG. 2 shows the basic processes constituting the method of forming a contact according to the present invention. In brief, after a contact hole is formed using a dry etching apparatus (step S40), an ashing process (step S42), a residue processing process (step S44), and a pretreatment process (step S46) are all performed in a pretreatment module. Subsequently, an upper layer is formed in a deposition module (step S48).

Figure 3:
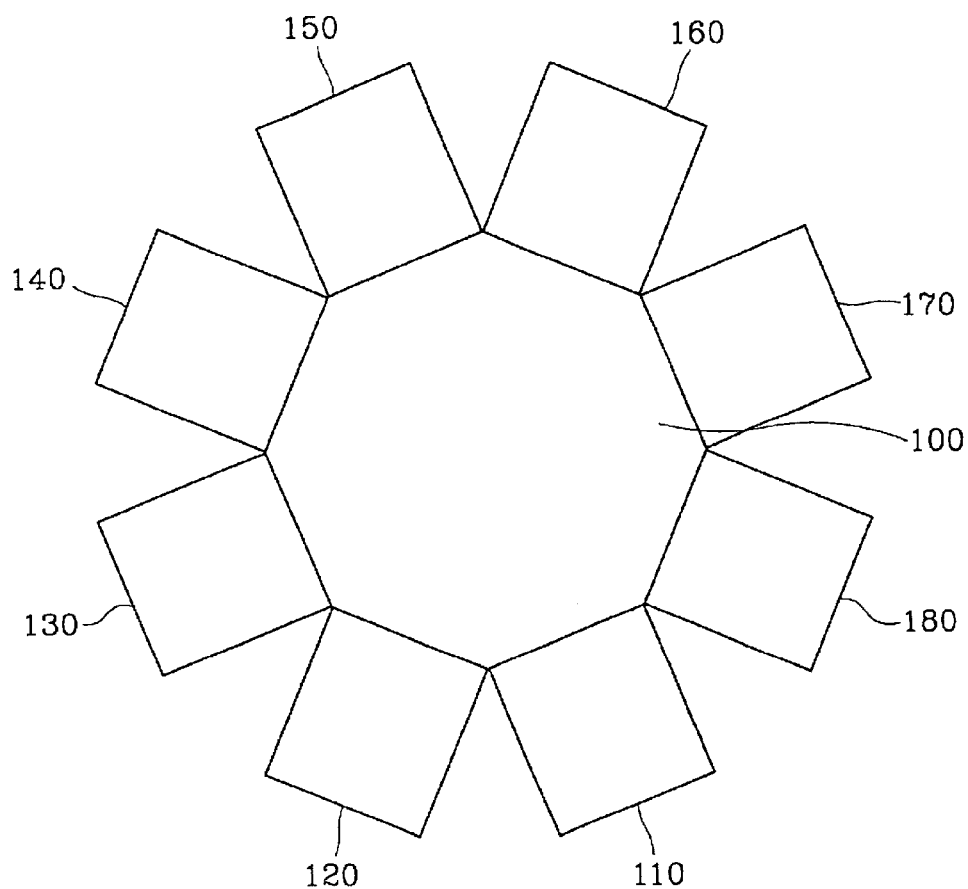
FIG. 3 is a schematic plan view of apparatus for forming a contact in the process of manufacturing a semiconductor device according to the present invention.

Before the method of forming a contact according to the present invention is described in more detail, however, the apparatus in which the method is executed will be described. Referring now to FIG. 3, the apparatus comprises a cluster of respective processing modules. A transfer module 100, in which a uniform vacuum is maintained, is disposed at the middle of the apparatus. Loading and unloading modules 110 and 120, a cooling module 130, pretreatment modules 140, 150, and 160, and deposition modules 170 and 180 are arranged around the transfer module 100.

A transfer apparatus (not shown) is provided in the transfer module 100 at the center thereof. A wafer is transferred from the loading module 110 to a specific pretreatment module 140, 150, or 160 by the transfer apparatus. After the pretreatment processes are performed, the wafer is transferred from a pretreatment module to a deposition module 170 or 180 through the transfer module 100 in which a vacuum is maintained. The upper layer that fills the contact hole is formed on the wafer in a deposition module. If the temperature of the wafer is too high after the last pretreatment process, the wafer can be transferred to the cooling module 130 before the upper layer is formed. The cooling module 130 can also be used to cool the wafer to an appropriate temperature after the deposition process but before the wafer is transferred to the unloading module 120. Although three pretreatment modules and two deposition modules are shown in FIG. 3, the apparatus may have other numbers of pretreatment and deposition modules, if necessary.

Figure 4:
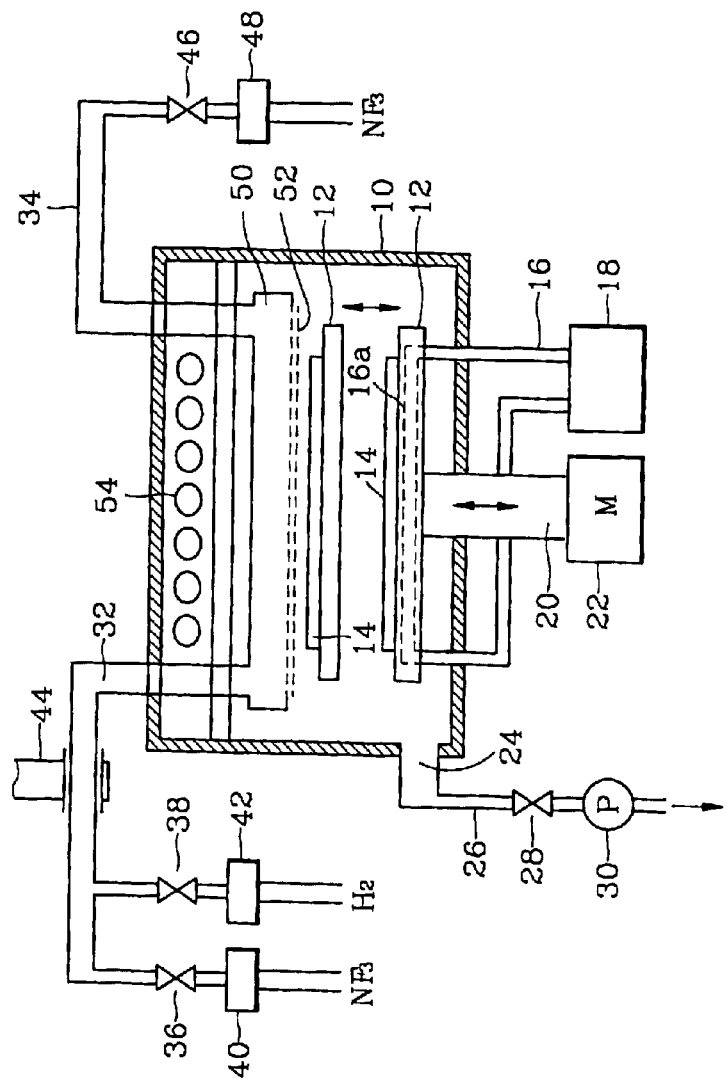
FIG. 4 is a schematic diagram of a first embodiment of a plasma pretreatment module of the apparatus shown in FIG. 3.

FIG. 4 shows an embodiment of a pretreatment module comprising a remote plasma generating apparatus. Such a remote plasma generating apparatus is disclosed in Korean Patent Application No. 99-46365.

Referring to FIG. 4, the pretreatment module includes a vacuum chamber 10, a microwave guide 44, which constitutes a remote plasma generating apparatus for exciting reaction gas into plasma and transferring the reaction gas in the plasma state to the vacuum chamber 10, a gas diffuser, a heater 54 for carrying out an annealing process in the same chamber, and a susceptor 12 for positioning the wafer in the vacuum chamber 10.

More specifically, the susceptor 12, on which the wafer 14 is mounted, is disposed at the center of the vacuum chamber 10. The susceptor 12 can be moved from the lower portion of the vacuum chamber 10 to the upper portion of the vacuum chamber 10 and vice versa (as shown by the arrow ↕) via shaft 20 and motor 22. The temperature of the wafer 14 is controlled by the temperature of the susceptor 12. A cooling line 16a extends through the susceptor 12 for supplying cooling water or cooling gas to control the temperature of the susceptor 12 and hence, the wafer 14, in order to secure the reproducibility of the processes. A first pipe 16 for supplying the cooling water or the cooling gas from a cooling water or cooling gas supplying apparatus 18 is connected to the cooling line 16a.

The reaction gas is supplied to the vacuum chamber 10 through the gas diffuser. The gas diffuser includes a preparatory chamber 50 for receiving the reaction gas from second and third pipes 32 and 34 extending outside the vacuum chamber 10, and a perforated plate 52 connected to the bottom of the preparatory chamber 50 for distributing gas evenly throughout the vacuum chamber 10. The second pipe 32 is for supplying gas in a plasma state. A hydrogen gas supply source (designated "$H_2$") and a fluorine-based gas supply source (designated "$NF_3$") are connected to one end of the second pipe 32. Switching valves 36 and 38 and mass flow controllers (MFC) 40 and 42 for controlling the amount of gas are installed near the hydrogen gas supply source and the fluorine-based gas supply source, respectively. Gas from the fluorine-based gas supply source and the hydrogen gas supply source passes through the switching valves 36 and 38 and the mass flow controllers 40 and 42, respectively, to the microwave guide 44 whereupon the gas is excited. The third pipe 34 is for supplying a natural fluorine-based gas. A fluorine-based gas supply source (designated "$NF_3$") is connected to one end of the third pipe 34. A switching valve 46 and an MFC 48 are installed in the third pipe 34 near the fluorine-based gas supply source.

The source gas used in the method of the present invention, however, is not limited to hydrogen ($H_2$) and fluorine-based ($NF_3$) gases. For instance, oxygen ($O_2$), nitrogen ($N_2$), and argon (Ar) can be used as source gases.

An exhaust port 24 is provided at the bottom of the vacuum chamber 10 for exhausting gas from the vacuum chamber 10 in order to maintain a proper vacuum level in the vacuum chamber 10. A fourth pipe 26 is connected to the exhaust port 24, and a switching valve 28 and a vacuum pump 30 are installed in the fourth pipe 26.

The pressure inside the vacuum chamber is automatically controlled by a smart valve (not shown) installed at the bottom of the vacuum chamber 10. A heater 54 for annealing the wafer 14 is interposed between the top of the preparatory chamber 50 and the ceiling of the vacuum chamber 10. The heater 54 can be an Ultraviolet (UV) lamp or a laser.

Figure 5:
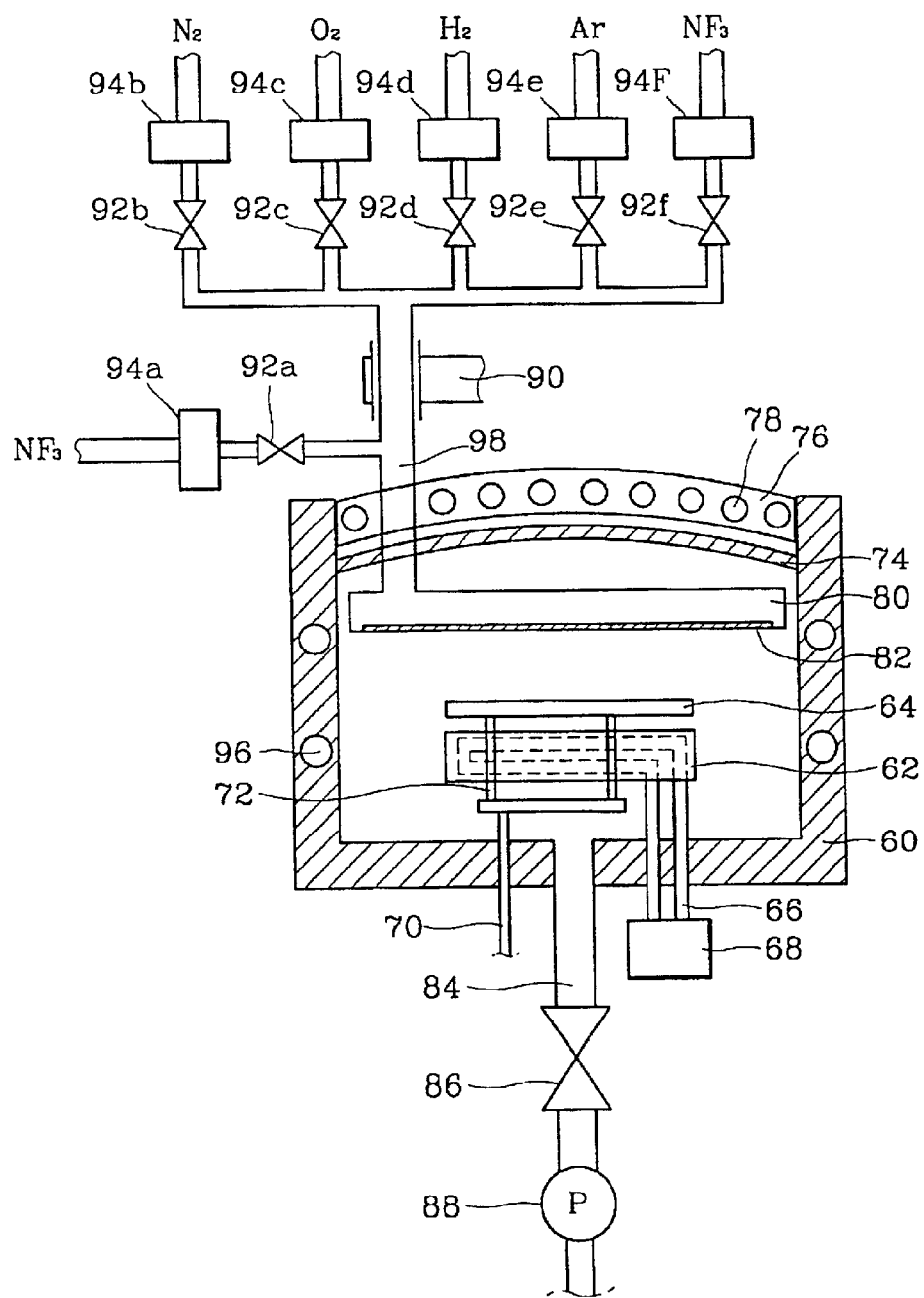
FIG. 5 is a schematic diagram of another embodiment of the plasma pretreatment module.

FIG. 5 schematically shows another embodiment of the pretreatment module. The pretreatment module of this embodiment includes a vacuum chamber 60, a microwave guide 90, which constitutes a remote plasma generating apparatus for exciting the reaction gas into a plasma and transferring the reaction gas in a plasma state to the vacuum chamber 60, a gas diffuser, UV lamps 78 for performing an annealing process in the chamber 60, and a susceptor 62 for supporting a wafer 64.

The internal walls of the vacuum chamber 60 are coated with an anodized film to prevent the internal walls from being eroded by fluorine ions. The side walls of the vacuum chamber 60 are provided with heaters 96. The upper wall 76 of the vacuum chamber is domed. More specifically, the upper wall comprises a light fixing unit 76 in which the UV lamps 78 are integrated, and a transparent window 74 made of sapphire extending just beneath the UV lamps 78.

The susceptor 62, on which a wafer 64 is mounted, is disposed the center of the lower portion of the vacuum chamber 60. A lift pin 72 for moving the wafer 64 up and down extends through the susceptor 62. The lift pin 72 is mounted to a pin holder 70 which is driven up and down. The temperature of the wafer 64 is controlled by the temperature of the susceptor 62. A cooling line extends through the susceptor 62 for supplying cooling water or cooling gas to control the temperature of the susceptor 62 and hence, the wafer 64, in order to secure the reproducibility of the processes. A first pipe 66 for supplying the cooling water or the cooling gas from a cooling water or cooling gas supplying apparatus 68 is connected to the cooling line.

The reaction gas is supplied into the vacuum chamber 60 through the gas diffuser. The gas diffuser includes a preparatory chamber 80 for receiving reaction gas from a second pipe 98 extending outside the vacuum chamber 60, and a perforated plate 82 connected to the bottom of the preparatory chamber 80 for distributing gas evenly throughout the vacuum chamber 60. A pipe connected to a fluorine-based gas supply source ("$NF_3$") is in turn connected to the second pipe 98 for supplying the fluorine-based gas into the vacuum chamber. A switching valve 92a and a MFC 94a are installed in the pipe, thus controlling the supply of fluorine-based gas. A microwave guide 90 for generating plasma is installed at the second pipe 98. The supply of nitrogen gas, oxygen gas, hydrogen gas, argon gas, and $NF_3$ gas through the pipe 98 to the microwave guide 90 is controlled by MFCs 92b, 92c, 92d, and 92f and switching valves 94b, 94c, 94d, 94e, and 94f, respectively.

An exhaust port is disposed at the bottom of the vacuum chamber 60 for exhausting gas from the vacuum chamber 60 in order to maintain a vacuum in the vacuum chamber 60. A third pipe 84 is connected to the exhaust port, and a switching valve 86 and a vacuum pump 88 are installed in the third pipe 84.

Hereinafter, the forming of a contact according to the present invention using apparatus that includes a pretreatment module of the type shown in FIG. 4 or FIG. 5 will be described.

FIGS. 6 through 10 show the processes of forming a self-aligned contact (SAC) of a semiconductor device according to the present invention.

Figure 6:
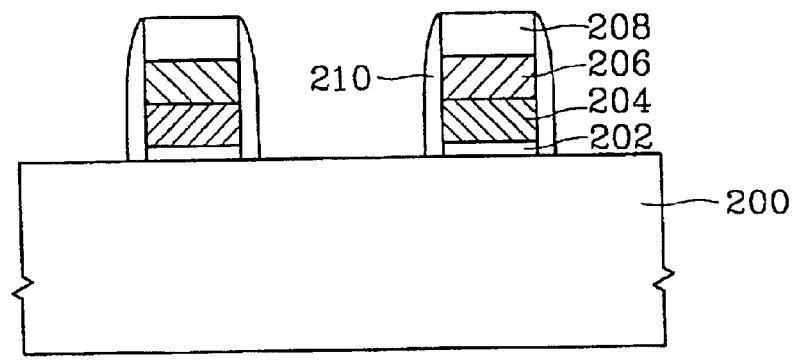
FIGS. 6 through 10 are sectional views of a substrate showing a method of forming a contact according to the present invention.

Referring to FIG. 6, a gate electrode pattern is formed on a silicon substrate 200. First, a gate insulating layer 202, a polysilicon layer 204, a silicide layer 206, and a mask layer 208 of silicon nitride are sequentially formed on the silicon substrate 200. Subsequently, the above layers are patterned using conventional photolithography to form gate electrodes. Spacers 210 are formed on the side walls of the gate electrodes by forming a silicon nitride layer over the entire structure and then etching the silicon nitride layer from the surface of the silicon substrate 200.

Figure 7:
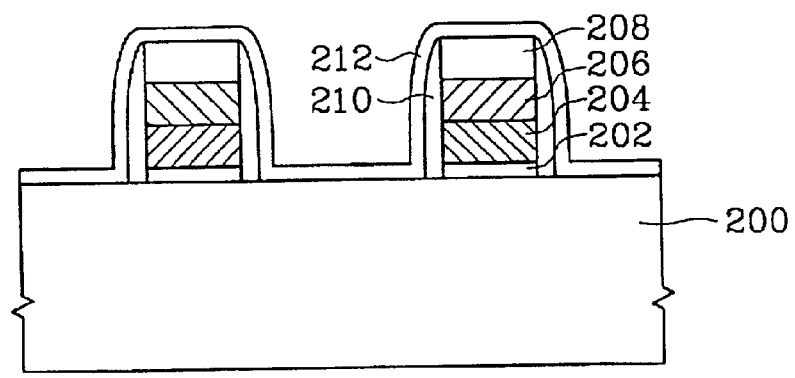

Referring to FIG. 7, an etch stop layer 212 of silicon nitride is formed on the entire surface of the silicon substrate 200 by chemical vapor deposition (CVD). The etch stop layer 212 operates to stop the subsequent etching process used to form the SAC and thus, to prevent the surface of the silicon substrate 200 from being damaged between the gate electrode patterns.

Figure 8:
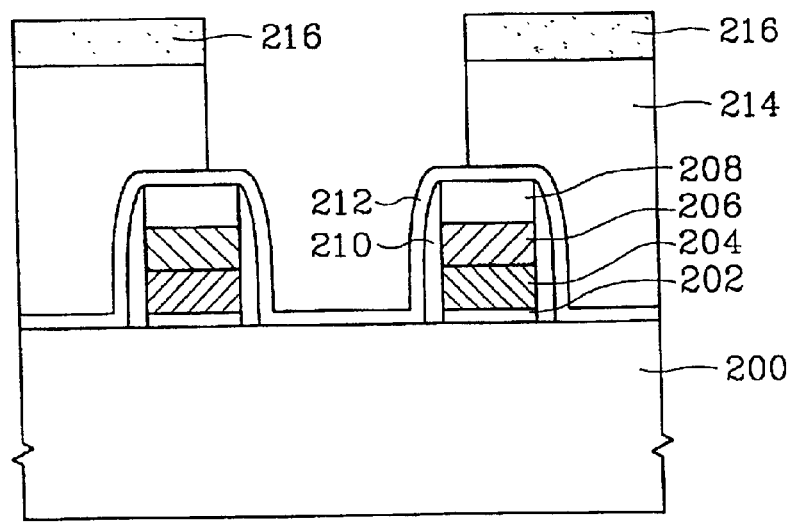

Referring to FIG. 8, an interlayer dielectric film 214 of silicon oxide having an etching selectivity with respect to the etch stop layer 212 is formed to a predetermined thickness. Next, a contact hole is formed in the interlayer dielectric film 214 using the dry etching apparatus (step S40). More specifically, the contact hole is formed by an SAC process.

In this respect, a photoresist pattern 216 is formed in the pretreatment module. The photoresist pattern is used to form a contact hole that corresponds to the width of the space between the gate electrode patterns. The smaller the space between the gate electrode patterns, the more difficult it becomes to form the photoresist pattern using a typical photolithography process because of inherent limitations in the resolution of the process. Accordingly, the photoresist pattern is designed to form a contact hole that is larger than the width of the space between the gate electrode patterns. The interlayer dielectric film 214 is anisotropically etched using the photoresist pattern as an etching mask, whereby the contact hole is self-aligned by the mask layer 208 and the spacer 210 of each gate electrode pattern. When the interlayer dielectric film 214 is etched, the etching stop layer 212 is exposed between the gate electrode patterns.

Figure 9:
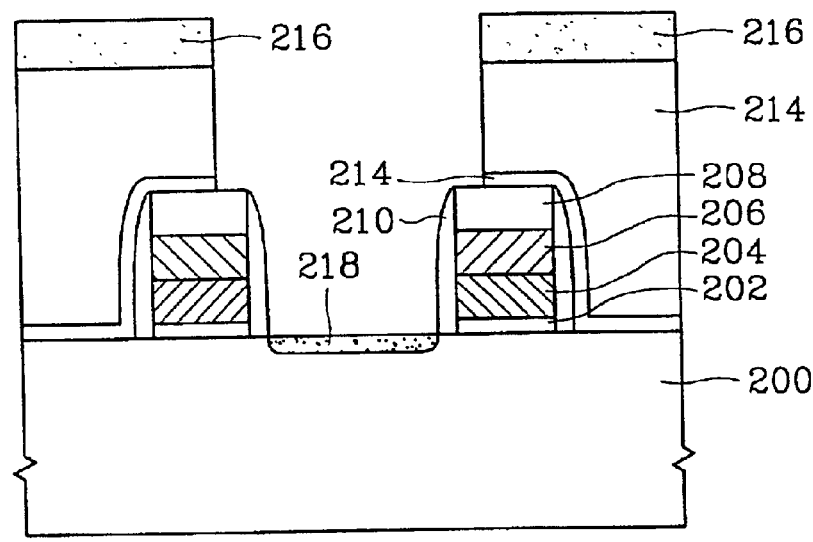

Referring to FIG. 9, the silicon substrate 200 between the gate electrode patterns is exposed by etching the etching stop layer 212 under different etching conditions than those under which the interlayer dielectric film 214 is etched. Hence, the contact hole is formed. At this time, a damaged layer 218 is produced at the surface of the exposed silicon substrate 200 between the gate electrode patterns. In addition, various contaminants are left on the surface of the exposed silicon substrate 200 between the gate electrode patterns After the silicon substrate 200, in which the contact hole is formed, is transferred to the pretreatment module shown in FIG. 4 or 5, the ashing process S42, the residue processing process S44, and the pretreatment cleaning process S46 are sequentially carried out. The conditions prevailing in the pretreatment module during these processes will now be described in detail.

First, the ashing process for removing the photoresist pattern 216 is performed. In this process, the UV lamp emits UV light having a wavelength of 200–500 nm and operates at a power of 300–1,000 W. The power of the microwave guide is 500–2,000 W. The pressure in the pretreatment module is 0.1–10 Torr. The temperature of the silicon substrate 200 is 25–300° C. The ashing process is performed under these conditions by nitrogen and oxygen supplied into the module in the state of a plasma at rates of 10–2,000 sccm and 10–2,000 sccm, respectively. Note, the photoresist pattern is removed more effectively by UV light than by the means used in the conventional ashing process. Thus, an additional strip process is not required.

Next, the residue processing process of removing the damaged layer 218 is performed by supplying nitrogen and oxygen into the module in the state of a plasma and by supplying fluorine-based gas into the module. In this process, the power of the microwave guide is 500–2,000 W. The pressure in the pretreatment module is 0.1–10 Torr. The temperature of the silicon substrate is 5–300° C. The nitrogen is supplied as reaction gas at a rate of 10–2,000 sccm, the oxygen at a rate of 10–2,000 sccm, and the fluorine-based gas ($NF_3$) at a rate of 30–300 sccm.

The use of plasma to remove the damaged layer produces comparatively less damage in the underlayer than when the conventional residue processing processes are used. Moreover, the exposed surface of the silicon substrate 200 is not contaminated by carbon because $NF_3$, as opposed to a CF-based, gas is used.

Finally, the pretreatment cleaning process is performed in two steps, namely a chemical reaction step and an annealing step. The chemical reaction step involves supplying hydrogen and fluorine-based gas into the module, and chemically reacting the two gases with the oxide film formed on the surface of the silicon substrate 200 defining the bottom of the contact hole to thereby form a reaction layer. The annealing step removes the so-formed reaction layer.

Next, the specific conditions in the step of forming the reaction layer will be described. The power of the microwave guide is 500–2,000 W. The pressure in the plasma pretreatment module is 1–10 Torr. The temperature of the silicon substrate is 0–50° C. The nitrogen as reaction gas is supplied at a rate of 10–2,000 sccm, the hydrogen is supplied at a rate of 5–200 sccm, and the $NF_3$ is supplied at a rate of 10–300 sccm. As a result, the natural oxide film is transformed into a reaction layer of, for example, $(NH_4)_2SiF_6$. Such a reaction layer can be vaporized and thus removed.

The fluorine-based gas may be supplied in a plasma state or in a normal gaseous state. $NF_3$, $SF_6$, or $ClF_3$ may be used as the fluorine-based gas used. In the preferred embodiment, $NF_3$ is used. The hydrogen is supplied into the module in a plasma state. When the hydrogen and fluorine-based gas are supplied in the plasma state, the ratio of $NF_3$ gas to the hydrogen plasma is set to be 0.1–100, for example, and the mixture chemically reacts with the oxide film, that is the $SiO_2$. A by-product of the reaction, i.e., $(NH_4)_2SiF_6$, is formed where the mixture and the oxide film meet. Once the reaction layer achieves a certain thickness, the reaction layer operates as a barrier layer with respect to the chemical reaction. Hence, the chemical reaction stops. The annealing process is performed after the chemical reaction between the supply gas and the oxide film stops, whereby the reaction layer is vaporized and exhausted to the outside of the module. To this end, the annealing process is preferably performed at a temperature of 100–500° C. for 20–600 seconds. After contaminants such as the natural oxide film and the surface oxide are removed, a passivation layer combined with hydrogen atoms is formed on the exposed surface. Accordingly, the surface of the semiconductor substrate is prevented from being re-oxidized.

If the oxide film to be removed is as thin as a natural oxide film, the oxide film can be removed in one cycle of the pretreatment cleaning process. However, the two steps of the pretreatment cleaning process may be performed repeatedly as warranted by the thickness of the oxide film to be removed.

Furthermore, in the pretreatment cleaning process, the chemical reaction step and the annealing step are performed sequentially in the pretreatment module. When the pretreatment module of FIG. 4 is used, the chemical reaction step can be carried out while the semiconductor substrate is positioned in the lower portion of the vacuum chamber 10, and the annealing step can be carried out while the semiconductor substrate is positioned in the upper portion of the vacuum chamber 10 in which the UV lamp 54 is disposed.

Figure 10:
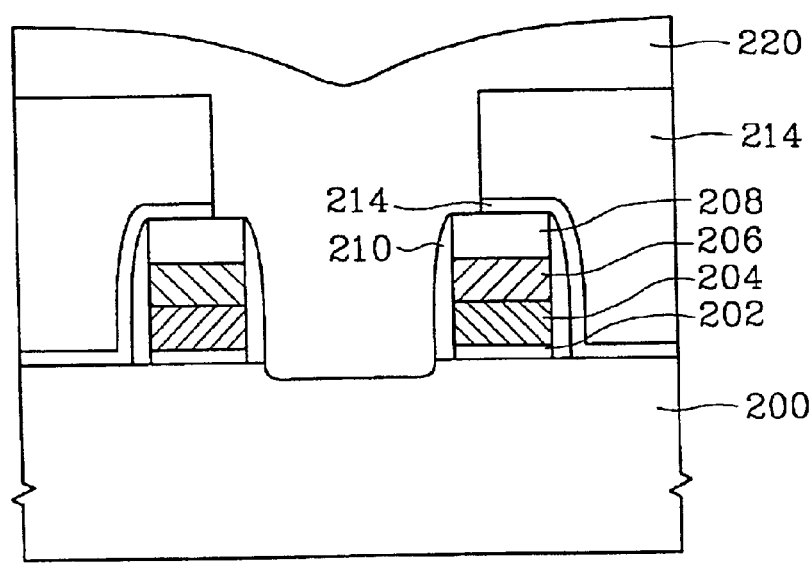

Referring to FIG. 10, the silicon substrate 200, which has undergone the pretreatment cleaning process, is transferred from a pretreatment module 140, 150, or 160 (FIG. 3) to a deposition module 170 or 180 of FIG. 3 through the transfer module 100 while in a vacuum. The subsequent (upper) layer 220 is then formed. Various conductive metal films may be used as the upper layer 220.

As will be appreciated by those of ordinary skill in the art, the present invention reduces processing time and manufacturing costs in comparison with the prior art because (1) the ashing process, the residue processing process, and the pretreatment cleaning process are sequentially performed in a pretreatment module using plasma, and (2) a PR strip process is not required because the photoresist is rather efficiently removed by the ashing process performed using oxygen plasma and UV light.

Second, the present invention can be used to produce semiconductor devices having improved electrical characteristics because fluorine-based gas and oxygen are used to remove the damaged layer at the bottom of the contact hole, instead of a gas comprising carbon. That is, the residue processing process of the present invention minimizes any further damage to the layer exposed at the bottom of the contact hole and does not leave any carbon pollution thereon.

Third, the use of the present invention will not degrade the profile of the contact hole or leave water spots, because the pretreatment process are carried out using plasma dry etching instead of the conventional wet etching.

Fourth, the present invention minimizes the contamination of the substrate and prevents a natural oxide film from being re-grown, during the time between processes, because the pretreatment module and the deposition module are clustered and connected through a means that can be maintained in a vacuum.

Although the present invention has been particularly shown and described with reference to the formation of an SAC between the gate electrode patterns, it will be understood by those skilled in the art that the present invention is not so limited and is applicable to various other methods in the manufacturing of semiconductor devices, such as the methods of forming metal and bit-line contacts. Also, the present invention can be applied to forming a contact hole in an interlayer disposed on an underlayer comprising silicon, e.g. pertains to the forming of a contact hole that exposes a polysilicon layer or a silicide layer. Therefore, all such applications that fall within the scope of the appended claims are seen to be within the true spirit of the present invention.

What is claimed is:

1. A method of manufacturing a contact of a semiconductor device, comprising the steps of:
   providing a semiconductor substrate on which an interlayer is formed on an underlayer comprising silicon;
   forming a contact hole in the interlayer using a photoresist pattern as an etching mask, wherein a surface of the underlayer is exposed at the bottom of the contact hole;
   loading the semiconductor substrate into apparatus having a plasma pretreatment module and a deposition module connected to each other, the plasma pretreatment module comprising a vacuum chamber, and plasma generating apparatus operative to provide the vacuum chamber with plasma;
   transferring the semiconductor substrate into the vacuum chamber of the plasma pretreatment module;
   ashing the photoresist pattern, in the vacuum chamber of the plasma pretreatment module, to remove the photoresist pattern;
   subsequently removing a damaged layer at the surface of the underlayer that defines the bottom of the contact hole, in the vacuum chamber of the plasma pretreatment module;
   subsequently cleaning the semiconductor substrate, in the vacuum chamber of the plasma pretreatment module;
   subsequently transferring the semiconductor substrate, while in a vacuum, from the vacuum chamber of the plasma pretreatment module to the deposition module; and
   depositing material onto the substrate that fills the contact hole, in the deposition module.

2. The method of claim 1, wherein said ashing, removing of the damaged layer, and pre-cleaning each comprise exciting gas outside of the pretreatment module using microwaves to induce a plasma state, and directing the gas in the plasma state towards the substrate within the pretreatment module.

3. The method of claim 2, wherein said ashing comprises heating the substrate, in the pretreatment module.

4. The method of claim 3, wherein said heating comprises generating ultraviolet (UV) light within the pretreatment module.

5. The method of claim 4, wherein said ashing comprises exciting nitrogen gas and oxygen outside of the pretreatment module using microwaves to induce the plasma state, and supplying the nitrogen gas and oxygen gas in a plasma state towards the substrate within the pretreatment module.

6. The method of claim 5, wherein said ashing comprises supplying the nitrogen gas at a rate of 10–2,000 sccm and the oxygen gas at a rate of 10–2,000 sccm as reaction gases, exciting the gases with a microwave power of 500–2,000 W, maintaining a pressure of 0.1–10 Torr within the plasma pretreatment module, regulating the temperature of the substrate to 25–300° C., and operating a UV lamp at 300–1,000 W of power to supply the UV light.

7. The method of claim 1, wherein said removing of the damaged layer comprises exciting nitrogen gas and oxygen outside of the pretreatment module using microwaves to induce the plasma state, and supplying the nitrogen gas and oxygen gas in the plasma state and a fluorine-based gas towards the substrate within the pretreatment module.

8. The method of claim 7, wherein the fluorine-based gas is $NF_3$.

9. The method of claim 8, wherein said removing of the damaged layer comprises supplying the nitrogen gas at a rate of 10–2,000 sccm, the oxygen gas at a rate of 10–2,000 sccm, and the $NF_3$ gas at a rate of 30–300 sccm as reaction gases, exciting the nitrogen gas and the oxygen gas with a microwave power of 500–2,000 W, maintaining a pressure of 0.1–10 Torr within the plasma pretreatment module, and regulating the temperature of the semiconductor substrate to 5–300° C.

10. The method of claim 1, wherein said cleaning comprises supplying hydrogen gas in a plasma state and a fluorine-based gas onto the substrate to cause a chemical reaction to occur with an oxide layer on the underlayer comprising silicon, thereby forming a reaction layer, and annealing the reaction layer to vaporize the same.

11. The method of claim 10, wherein the fluorine-based gas is supplied in a gaseous state.

12. The method of claim 10, wherein said supplying of the fluorine-based gas comprises exciting fluorine-based gas outside of the pretreatment module using microwaves to induce a plasma state, and directing the fluorine-based gas in the plasma state onto the substrate.

13. The method of claim 10, wherein the fluorine-based gas is selected from the group consisting of $NF_3$, $SF_6$, and $ClF_3$.

14. The method of claim 10, wherein said cleaning comprises supplying the nitrogen gas at a rate of 10–2,000 sccm, the hydrogen gas at a rate of 5–200 sccm, and the fluorine-based gas at a rate of 10–300 sccm as reaction gases, exciting the gases with a microwave power of 500–2,000 W, maintaining a pressure of 0.1–10 Torr within the plasma pretreatment module, and regulating the temperature of the semiconductor substrate temperature to 0–50° C.

15. The method of claim 10, wherein said cleaning comprises positioning the semiconductor substrate in a lower portion of the pretreatment module while supplying the gas to cause said chemical reaction, and positioning the substrate in an upper portion of the pretreatment module while the annealing is being carried out.

16. The method of claim of claim 10, wherein said annealing comprises heating the semiconductor substrate to within a range of 100–500° C.

17. A method of manufacturing a contact of a semiconductor device, comprising the steps of:
providing a semiconductor substrate on which an interlayer is formed on an underlayer comprising silicon;
forming a contact hole in the interlayer using a photoresist pattern as an etching mask, wherein a surface of the underlayer is exposed at the bottom of the contact hole;
ashing the photoresist pattern using plasma and UV light to remove the photoresist pattern, in a plasma pretreatment processing chamber;
subsequently removing a damaged layer at the surface of the underlayer that defines the bottom of the contact hole, using a plasma and a fluorine-based gas, in a plasma pretreatment processing chamber, whereby an oxide is formed at said surface;
subsequently cleaning the semiconductor substrate to remove said oxide in a plasma pretreatment processing chamber, said cleaning comprising directing a plasma that chemically reacts with the oxide onto the surface to form a reaction layer, and annealing the substrate to vaporize the reaction layer;
subsequently transferring the semiconductor substrate, while in a vacuum, to a deposition apparatus; and
depositing material onto the substrate that fills the contact hole, in the deposition apparatus.

18. The method of claim 17, wherein said ashing, removing of the damaged layer, and cleaning each comprise exciting gas using microwaves.

19. The method of claim 17, wherein said ashing comprises exciting nitrogen gas and oxygen using microwaves to induce a plasma state.

20. The method of claim 19, wherein said ashing comprises supplying the nitrogen gas at a rate of 10–2,000 sccm and the oxygen gas at a rate of 10–2,000 sccm as reaction gases, exciting the gases with a microwave power of 500–2,000 W, maintaining a pressure of 0.1–10 Torr within the plasma pretreatment processing chamber in which the ashing process is carried out, regulating the temperature of the substrate to 25–300° C., and operating a UV lamp having at 300–1,000 W of power to supply the UV light.

21. The method of claim 17, wherein the fluorine-based gas is $NF_3$.

22. The method of claim 21, wherein said removing of the damaged layer comprises supplying the nitrogen gas at a rate of 10–2,000 sccm, the oxygen gas at a rate of 10–2,000 sccm, and the $NF_3$ gas at a rate of 30–300 sccm as reaction gases, exciting the nitrogen gas and the oxygen gas with a microwave power of 500–2,000 W, maintaining a pressure of 0.1–10 Torr within the pretreatment processing chamber in which said removing of the damaged layer is carried out, and regulating the temperature of the semiconductor substrate temperature to 5–300° C.

23. The method of claim 17, wherein said cleaning comprises supplying hydrogen gas and nitrogen gas in a plasma state and a fluorine-based gas onto the substrate.

24. The method of claim 23, wherein the fluorine-based gas is supplied in a gaseous state.

25. The method of claim 24, wherein the supplying of the fluorine-based gas comprises exciting fluorine-based gas using microwaves to induce a plasma state.

26. The method of claim 25, wherein the fluorine-based gas is selected from the group consisting of $NF_3$, $SF_6$, and $ClF_3$.

27. The method of claim 23, wherein said cleaning comprises supplying the nitrogen gas at a rate of 10–2,000 sccm, the hydrogen gas at a rate of 5–200 sccm, and the fluorine-based gas at a rate of 10–300 scorn as reaction gases, exciting the gases with a microwave power of 500–2,000 W, maintaining a pressure of 0.1–10 Torr within the pretreatment processing chamber in which the cleaning is carried out, and regulating the temperature of the semiconductor substrate temperature to 0–50° C.

28. The method of claim 17, wherein said cleaning comprises positioning the semiconductor substrate in a lower portion of the pretreatment processing chamber while causing said chemical reaction to occur, and positioning the substrate in an upper portion of the pretreatment processing chamber while the annealing is being carried out.

29. The method of claim of claim 17, wherein said annealing comprises heating the semiconductor substrate to within a range of 100–500° C.

* * * * *